(12) United States Patent  
Kapoor et al.

(10) Patent No.: US 9,012,276 B2  
(45) Date of Patent: Apr. 21, 2015

(54) VARIATION RESISTANT MOSFETS WITH SUPERIOR EPITAXIAL PROPERTIES

(71) Applicant: Gold Standard Simulations Ltd., Glasgow, Scotland (GB)

(72) Inventors: Ashok K. Kapoor, Palo Alto, CA (US); Asen Asenov, Glasgow (GB)

(73) Assignee: Gold Standard Simulations Ltd., Glasgow, Scotland (GB)

( * ) Notice: Subject to any disclaimer, the term of this patent is extended or adjusted under 35 U.S.C. 154(b) by 0 days.

(21) Appl. No.: 14/323,177

(22) Filed: Jul. 3, 2014

(65) Prior Publication Data

US 2015/0011056 A1 Jan. 8, 2015

Related U.S. Application Data

(60) Provisional application No. 61/843,292, filed on Jul. 5, 2013.

(51) Int. Cl.
*H01L 21/00* (2006.01)
*H01L 29/66* (2006.01)

(52) U.S. Cl.
CPC .... *H01L 29/66537* (2013.01); *H01L 29/66575* (2013.01)

(58) Field of Classification Search
USPC .................................. 438/198, 301, 303, 305
See application file for complete search history.

(56) References Cited

U.S. PATENT DOCUMENTS

| 5,298,452 | A | 3/1994 | Meyerson |
| 5,314,547 | A | 5/1994 | Heremans et al. |
| 5,316,958 | A | 5/1994 | Meyerson |
| 6,180,978 | B1 | 1/2001 | Chatterjee et al. |
| 6,479,866 | B1 | 11/2002 | Xiang |
| 6,566,734 | B2 | 5/2003 | Sugihara et al. |
| 6,627,488 | B2 | 9/2003 | Lee |
| 6,630,710 | B1 | 10/2003 | Augusto |

(Continued)

FOREIGN PATENT DOCUMENTS

| EP | 0936676 | 8/1999 |
| WO | WO-2009/053327 | 4/2009 |
| WO | WO-2013/027092 | 2/2013 |

OTHER PUBLICATIONS

"International Search Report and Written Opinion of the International Searching Authority Dated Nov. 9, 2012, International Application No. PCT/IB2012/001068", (Nov. 9, 2012).

(Continued)

*Primary Examiner* — Richard Booth

(74) *Attorney, Agent, or Firm* — Blakely Sokoloff Taylor & Zafman LLP

(57) ABSTRACT

Variation resistant metal-oxide-semiconductor field effect transistors (MOSFET) are manufactured using a high-K, metal-gate 'channel-last' process. Between spacers formed over a well area having separate drain and source areas, a recess in the underlying is formed using a crystallographic etch to provide [111] boundaries adjacent the source and drain regions. An ion implant step localized by the cavity results in a localized increase in well-doping directly beneath the recess. Within the recess, an active region is formed using an un-doped or lightly doped epitaxial layer, deposited at a very low temperature. A high-K dielectric stack is formed over the lightly doped epitaxial layer, over which a metal gate is formed within the cavity boundaries.

18 Claims, 14 Drawing Sheets

(56) References Cited

U.S. PATENT DOCUMENTS

| | | | |
|---|---|---|---|
| 6,667,200 | B2 | 12/2003 | Sohn et al. |
| 6,812,157 | B1 | 11/2004 | Gadgil |
| 7,023,068 | B1 * | 4/2006 | Hopper et al. ............... 257/510 |
| 7,045,407 | B2 * | 5/2006 | Keating et al. ............... 438/198 |
| 7,459,752 | B2 | 12/2008 | Doris et al. |
| 7,589,347 | B2 | 9/2009 | Nash et al. |
| 7,906,413 | B2 | 3/2011 | Cardone et al. |
| 8,273,617 | B2 | 9/2012 | Thompson et al. |
| 8,748,986 | B1 | 6/2014 | Shifren et al. |
| 2001/0009292 | A1 | 7/2001 | Nishinohara et al. |
| 2002/0001930 | A1 | 1/2002 | Lee |
| 2002/0029372 | A1 | 3/2002 | Lee |
| 2002/0037619 | A1 | 3/2002 | Sugihara et al. |
| 2003/0211681 | A1 | 11/2003 | Hanafi et al. |
| 2004/0201063 | A1 | 10/2004 | Fukuda |
| 2004/0206980 | A1 | 10/2004 | Cheong et al. |
| 2006/0022270 | A1 | 2/2006 | Boyd et al. |
| 2006/0046399 | A1 | 3/2006 | Lindert et al. |
| 2008/0001237 | A1 | 1/2008 | Chang et al. |
| 2008/0017887 | A1 | 1/2008 | Nagata et al. |
| 2009/0321820 | A1 | 12/2009 | Yamakawa |
| 2009/0321849 | A1 | 12/2009 | Miyamura et al. |
| 2010/0237433 | A1 | 9/2010 | Zampardi et al. |
| 2011/0073961 | A1 | 3/2011 | Dennard et al. |
| 2011/0074498 | A1 | 3/2011 | Thompson et al. |
| 2011/0212583 | A1 | 9/2011 | Neudeck |
| 2011/0260220 | A1 | 10/2011 | Chi et al. |
| 2013/0001706 | A1 | 1/2013 | Haran et al. |

OTHER PUBLICATIONS

"International Search Report and Written Opinion of the International Searching Authority Dated Nov. 9, 2012, International Application No. PCT/IB2012/001069", (Nov. 9, 2012).

"International Search Report and Written Opinion of the International Searching Authority Dated Nov. 13, 2013, International Application No. PCT/IB2013/001637", (Nov. 13, 2013).

"Notice of Allowance Dated Nov. 14, 2014; U.S. Appl. No. 13/424,727", (Nov. 14, 2014).

"Office Action Dated Aug. 13, 2013; U.S. Appl. No. 13/424,745", (Aug. 13, 2013).

"Office Action Dated Jul. 7, 2014; U.S. Appl. No. 13/424,745", (Jul. 7, 2014).

"Office Action Dated Jul. 7, 2014; U.S. Appl. No. 13/950,834", (Jul. 7, 2014).

"Office Action Dated Jul. 8, 2014; U.S. Appl. No. 13/950,810", (Jul. 8, 2014).

"Office Action Dated Jul. 8, 2014; U.S. Appl. No. 13/950,868", (Jul. 8, 2014).

"Office Action Dated May 7, 2014; U.S. Appl. No. 13/424,727", (May 7, 2014).

"Office Action Dated Nov. 22, 2013; U.S. Appl. No. 13/424,727", (Nov. 22, 2013).

"Office Action Dated Oct. 24, 2013; U.S. Appl. No. 13/424,745", (Oct. 24, 2013).

"Office Action Dated Oct. 24, 2014; U.S. Appl. No. 13/950,868", (Oct. 24, 2014).

"Office Action Dated Oct. 27, 2014; U.S. Appl. No. 13/950,834", (Oct. 27, 2014).

"Office Action Dated Oct. 3, 2014; U.S. Appl. No. 13/950,810", (Oct. 3, 2014).

Asenov, Asen, "Random Dopant Induced Threshold Voltage Lowering and Fluctuations in Sub-0.1 μm MOSFET's: A 3-D "Atomistic" Simulation Study", *IEEE Transactions on Electron Devices*, vol. 45, No. 12, (Dec. 1998), pp. 2505-2513.

Asenov, Asen, "Random Dopant Threshold Voltage Fluctuations in 50nm Epitaxial Channel MOSFETs: A 3D 'Atomistic' Simulation Study", *ESSDERC '98: 28th Conference on European Solid-State Devices*, Bordeax, France, (Sep. 8-10, 1998), pp. 300-303.

Asenov, Asen, et al., "Suppression of Random Dopant-Induced Threshold Voltage Fluctuations in Sub-0.1-μm MOSFET's with Epitaxial and δ-Doped Channels", *IEEE Transactions on Electron Devices*, vol. 46, No. 8, (Aug. 1999), pp. 1718-1724.

Bruel, M., "Silicon on insulator material technology", *Electronics Letters*, vol. 31, No. 14, (Jul. 6, 1995), pp. 1201-1202.

Colinge, Jean-Pierre, "Hot-Electron Effects in Silicon-On-Insulator n-Channel MOSFET's", *IEEE Transactions on Electron Devices*, vol. ED-34, No. 10, (Oct. 1987), pp. 2173-2177.

Courtland, Rachel, "Start-up Seeks New Life for Planar Transistors, SuVolta is pursuing precision doping in its bid to compete with 3-D transistor technology", *ieee spectrum tech alert*, (Dec. 8, 2011), 3 pp. total.

Frank, Martin M., "High-k / Metal Gate Innovations Enabling Continued CMOS Scaling", *2011 Proceedings of the ESSCIRC*, (Sep. 12-16, 2011), pp. 50-58.

Fu, Y., et al., "Subband structure and ionized impurity scattering of the two dimensional electron gas in δdoped field effect transistor", *Journal of Applied Physics*, vol. 78, No. 5, (Sep. 1, 1995), pp. 3504-3510.

Fujita, K., et al., "Advanced Channel Engineering Achieving Aggressive Reduction of VT Variation for Ultra-Low-Power Applications", *Electron Devices Meeting (IEDM), 2011 IEEE International*, (Dec. 2011), pp. 32.3.1-32.3.4.

Hokazono, Akira, et al., "25-nm Gate Length nMOSFET With Steep Channel Profiles Utilizing Carbon-Doped Silicon Layers (A P-Type Dopant Confinement Layer)", *IEEE Transactions on Electron Devices*, vol. 58, No. 5, (May 2011), pp. 1302-1310.

Kuhn, Kelin J., et al., "Process Technology Variation", *IEEE Transactions on Election Devices*, vol. 58, No. 8, (Aug. 2011), pp. 2197-2208.

Maleville, Christophe, "Extending planar device roadmap beyond node 20nm through ultra thin body technology", *2011 International Symposium on VLSI Technology, Systems and Applications (VLSI-TSA)*, (Apr. 25-27, 2011), pp. 1-4.

Markov, Stanislov, et al., "Statistical Variability in Fully Depleted SOI MOSFETs Due to Random Dopant Fluctuations in the Source and Drain Extensions", *IEEE Electron Device Letters*, vol. 33, No. 3, (Mar. 2012), pp. 315-317.

Meyer, J. E., et al., "High Performance, Low Power CMOS Memories Using Silicon-On-Sapphire Technology", *1971 International Electron Devices Meeting*, (1971), p. 44.

Noda, Kenji, et al., "A 0.1-μm Delta-Doped MOSFET Fabricated with Post-Low-Energy Implanting Selective Epitaxy", *IEEE Transactions on Electron Devices*, vol. 45, No. 4, (Apr. 1998), pp. 809-813.

Pawlak, B. J., et al., "Effect of amorphization and carbon co-doping on activation and diffusion on boron in silicon", *Applied Physics Letters*, 89, 062110, (2006), pp. 062110-1 to 062110-3.

Pawlak, B. J., et al., "Suppression of phosphorus diffusion by carbon co-implantation", *Applied Physics Letters*, 89, 062102, (2006), pp. 062102-1 to 062102-3.

Roy, G., et al., "Random dopant fluctuation resistant 'bulk' MOSFETs with epitaxial delta doped channels", *Ultimate Integration in Silicon (ULIS) Conference*, Glasgow, Scotland, (2007), 4 pp. total.

Takeuchi, Kiyoshi, et al., "Channel Engineering for the Reduction of Random-Dopant-Placement-Induced Threshold Voltage Fluctuation", *1997 International Electron Devices Meeting (IEDM)*, Technical Digest, (Dec. 7-10, 1997), pp. 841-844.

* cited by examiner

VARIATION RESISTANT MOSFETS WITH SUPERIOR EPITAXIAL PROPERTIES

CROSS-REFERENCE TO RELATED APPLICATIONS

This application claims the benefit of U.S. Provisional Patent Application No. 61/843,292 filed Jul. 5, 2013.

BACKGROUND OF THE INVENTION

1. Field of the Invention

The present invention generally relates to the manufacturing of metal-oxide-semiconductor field effect transistors (MOSFETs), and more particularly to MOSFETs manufactured for reproducibility of threshold voltages among otherwise identical transistors.

2. Prior Art

Random variation in threshold voltage ($\sigma V_T$) of metal-oxide semiconductor (MOS) field effect transistors (MOSFETs) with high-K (high dielectric constant) metal gate stack is caused by some dominant factors: (i) random dopant fluctuations (RDF) in the well and in the pocket implant regions underneath the gate, which, among other things, cause variations in depletion layer thickness; (ii) line edge roughness (LER) which causes random variation in the length of the gate electrode resulting from random variations in pattern of the etched gate; and, (iii) metal gate granularity (MGG) which causes random variations in the local work function due to the grain structure of the gate material. There is a fourth source of variation, the random variations in the effective channel length, referred to as random extension fluctuations (RXF), arising from statistical variations in the position of the junction that separates the channel from either the source or the drain extensions. However, as MOSFETs become smaller, the effects of RDF, LER, and RXF increase and become major factors in determining $\sigma V_T$. The first effect, RDF, has recently gained intense attention. The randomness in the position of the drain extension RXF has two principal sources: a) variations in the final position of implanted ions due to scattering; and, b) variations in the activation and positions of the source/drain extension ions as influenced by the activation and subsequent heat treatments.

It is well-known in the art that as MOSFETs move to smaller and smaller dimensions, variability of the threshold voltage $\sigma V_T$ seriously undermines the reproducibility of threshold voltages among otherwise identical transistors. This effect is inevitable, and it is particularly severe in its impact on complimentary MOS (CMOS) static random access memories (SRAM), which use millions of near-minimum sized transistors. Development of ultra-thin silicon on insulator (SOI) structures, e.g., fully depleted SOI (FDSOI), and of three-dimensional transistors (FinFET and Tri-Gate), are largely motivated by a need to reduce the threshold voltage spreads $\sigma V_T$ caused by RDF. This CMOS technology transition away from the more traditional bulk MOS manufacturing adversely impacts costs and availability.

One method of addressing the RDF problem was described by Asenov and Saini in the paper "Suppression of Random Dopant-Induced Threshold Voltage Fluctuations in Sub-0.1-μm MOSFETs with Epitaxial and δ-Doped Channels," IEEE Transactions on Electron Devices, Vol. 46, No. 8, August 1999, Pages 1718-1724. This approach is consistent with bulk transistors, and does not have the same cost penalties associated with FinFETs and FDSOI. This scheme has three key components: a) placing a thin, approximately 10 nanometer (nm), undoped epitaxial layer immediately beneath the gate oxide; b) placing a thinner layer with a very high concentration of either acceptors for an NMOS device or donors for a PMOS device at the boundary of the thin epitaxial layer that is remote from the gate dielectric interface; and, c) incorporating a moderately heavily doped well layer beneath the un-doped epitaxial layer and the highly doped, thinner layer. Asenov uses hundreds of simulations with Monte Carlo variations of the charge status at each atomic site within the transistor structure. FIG. 1 shows simulation curves from this prior art without a δ-layer, demonstrating that the $\sigma V_T$ is a function of the thickness of an undoped epitaxial layer. A conventional transistor is equivalent to $d_{epi}=0$ in this figure. Implicit in this curve is the fact that, for a given charge density beneath the epitaxial layer, the electrostatic component of the threshold voltage diminishes with increasing thickness of that layer. FIG. 1 also shows that there may be a range of optimum values for the epi thickness. This work was expanded by Roy, Brown and Asenov in "Random dopant fluctuation resistant 'bulk' MOSFETs with epitaxial delta doped channels," presented at the 2007 ULSI Conference. In this work, it is shown that the thickness of an undoped epitaxial layer reduces the threshold voltage variations as shown in FIG. 2, but it also tends to lower the threshold voltage as shown in FIG. 3. This means that the definition of the epi layer and the doping beneath it represent a design trade-off.

Similar structures have been subsequently demonstrated by Fujita et al. as described in their paper "Advanced Channel Engineering Achieving Aggressive Reduction of $V_T$ Variation for Ultra-Low-Power Applications", Electron Devices Meeting (IEDM), 2011 IEEE International, pp. 32.3.1-32.3.4, 5-7 Dec. 2011. A related approach to realizing an epitaxial transistor has been patented by Thompson and Thummalapally in "Electronic devices and systems, and methods for making and using the same," U.S. Pat. No. 8,273,617, Sep. 25, 2012.

Recent changes to gate architectures from poly-silicon over silicon dioxide or oxynitride, to metal over high-K gate dielectric stack have changed the processing sequence. (A high-K or high dielectric constant as used herein and in the claims to follow means a dielectric constant that is higher than the dielectric constant of silicon dioxide for which K=3.9; an effective dielectric constant K exceeding 6 would be a preferred high-K.) This is particularly true for the "gate last" process flow. In this process, while there is seemingly a complete transistor, with oxide and/or nitride sidewall spacers on each side of a poly gate, the gate is actually a sacrificial structure. That gate structure and the underlying protective oxide are etched away, exposing the silicon surface. Then a sequence of steps is employed: a) deposition of a high-K gate dielectric, typically by atomic layer deposition; b) deposition of a metal gate having a controlled work function to set the threshold voltage; and, c) deposition of a robust gate material, typically doped amorphous silicon. In many cases the sequence above is augmented by chemical-mechanical polishing steps to assure the localization of the various layers. However, this structure does not overcome the deficiencies resulting from RDF, LER or RXF. The morphology of the metal in the gate last process does reduce the variations identified as MGG, compared to a gate first process.

Structures which address all variations, RDF, LER and RXF, have been described by Asenov in "Variation resistant metal-oxide-semiconductor field effect transistor (MOSFET)" U.S. App 2013/0049140 (Feb. 28, 2013). Similar structures lacking consideration for random doping density fluctuations have been described by Sugihara, et al. ("Semiconductor device," U.S. Pat. No. 6,566,734, May 20, 2003) and by Lee, et al. ("Method for fabricating a semiconductor device using a damascene process," U.S. Pat. No. 6,627,488, Sep. 30, 2003). All three authors require the growth of a thin layer of epitaxial semiconductor in a nominally square, etched recess. This type of epitaxial growth could be heavily subject to faceting and the creation of defects along the sidewalls. The resulting defects create leakage to the substrate, potential barriers in the current path and weak spots in the gate oxide.

FIG. 4 shows an exemplary cross-section of the essential parts of a transistor formed without the benefits of this invention. A silicon substrate 100 is partitioned to support individual transistors by shallow trench isolation 102. The transistor per se is defined by a source and drain 104. Because of the symmetry of the illustrative FET, the source and drain are both given the same identifying number. In order to reduce parasitic resistance, the sources and drains are buttressed with low resistance epitaxial layers 106. The channel region 108 consists of zero or very lightly doped epitaxial silicon. Beneath that, region 110 is very highly doped, P-type for NMOS transistors or N-type for PMOS transistors. The gate structure consists of a high-K gate dielectric 112, a metallic gate 114 and a protective gate "handle" 116. The gate structure is separated from interlayer dielectric 118 by dielectric gate spacers 120. Of particular note is the shape of the epitaxial region 108; it is square, possibly with [110] sidewalls. This configuration is at risk for creating facets during the growth of the zero-doped epitaxial layer. Facets would interrupt the channel surface, creating sites with excessive leakage in the gate dielectric and scattering discontinuities in the conductive channel and degrading both device performance and repeatability among otherwise "identical" devices.

It would therefore be advantageous to find a solution that has the advantages of reducing all the sources of variation, as described by Asenov, but offered a favorable configuration for growing the necessary epitaxy without facets.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention will be apparent from the following detailed description taken in conjunction with the accompanying drawings.

FIG. 6A is a schematic cross-section showing the location, defined by trench isolation, of a transistor according to an embodiment of the invention.

FIG. 6O is a schematic cross-section showing the results of depositing the second interlayer dielectric, etching contact holes, filling those contact holes with CVD metal and chemical mechanical polishing the surface to complete the FEOL steps creating the transistor.

DETAILED DESCRIPTION OF THE PREFERRED EMBODIMENTS

Figure 1:
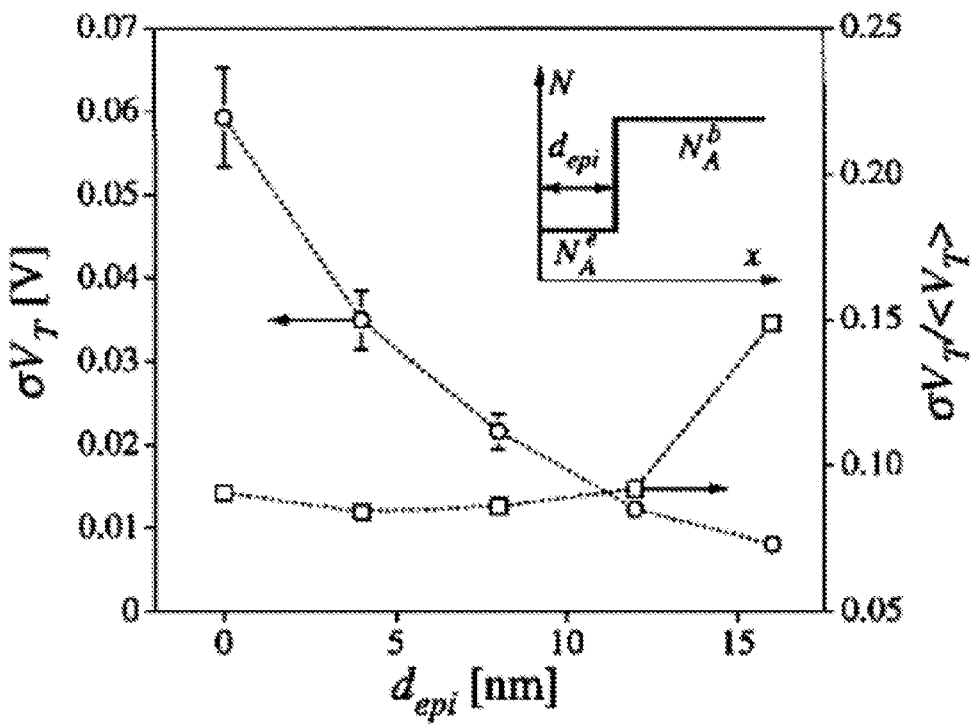
FIG. 1 is a prior art graph showing the standard deviation of the threshold voltage of $\sigma V_T$ as a function of the thickness of the epitaxial channel layer $d_{epi}$, for a set of MOSFETs with $L_{eff}=0.05$ $W_{eff}=0.05$ $N^e_A=1\times10^{15}$ cm$^{-3}$, $N^b_A=5\times10^{18}$ cm$^{-3}$, and $t_{ox}=3$ nm for samples of 200 transistors.
Figure 2:
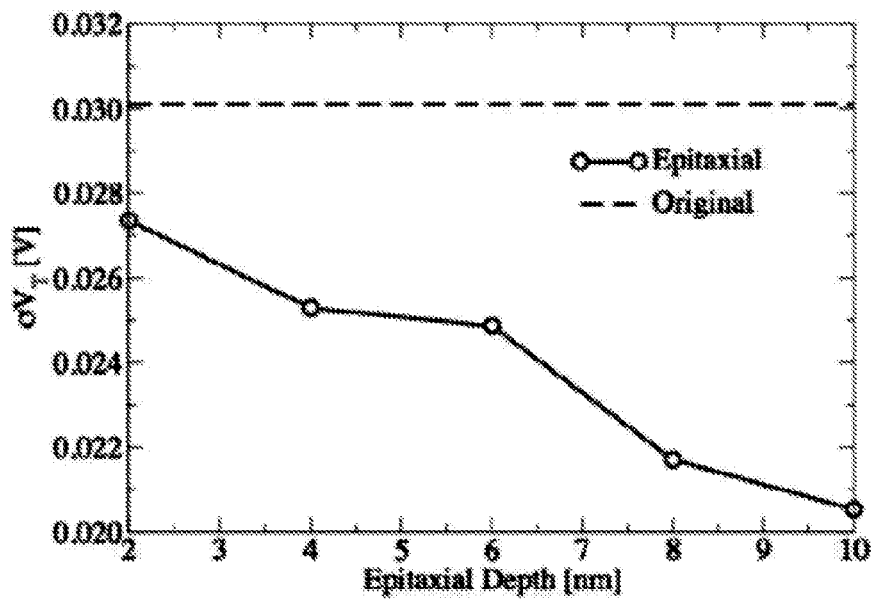
FIG. 2 is a prior art graph showing $\sigma V_T$ of 200 'atomistically' different devices for both the original 35 nm MOSFET, shown as a dashed line, and for the epitaxial MOSFETs with epitaxial depth 2 nm, 4 nm, 6 nm, 8 nm and 10 nm.
Figure 3:
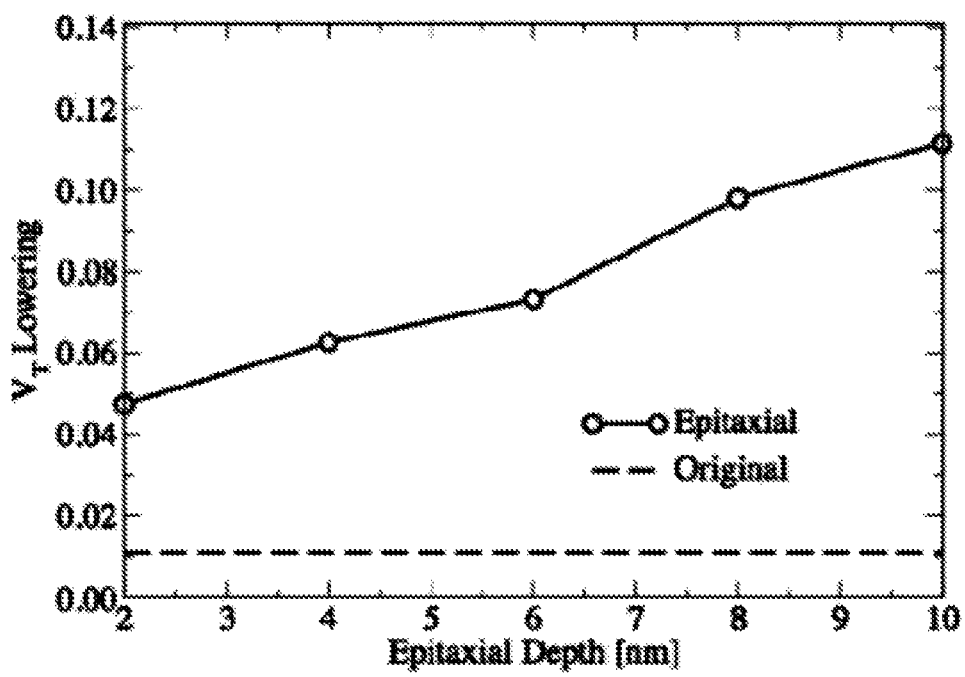
FIG. 3 is a prior art graph showing threshold voltage lowering in the original 35 nm MOSFET (dashed lines) and in the corresponding epitaxial MOSFETs.
Figure 4:
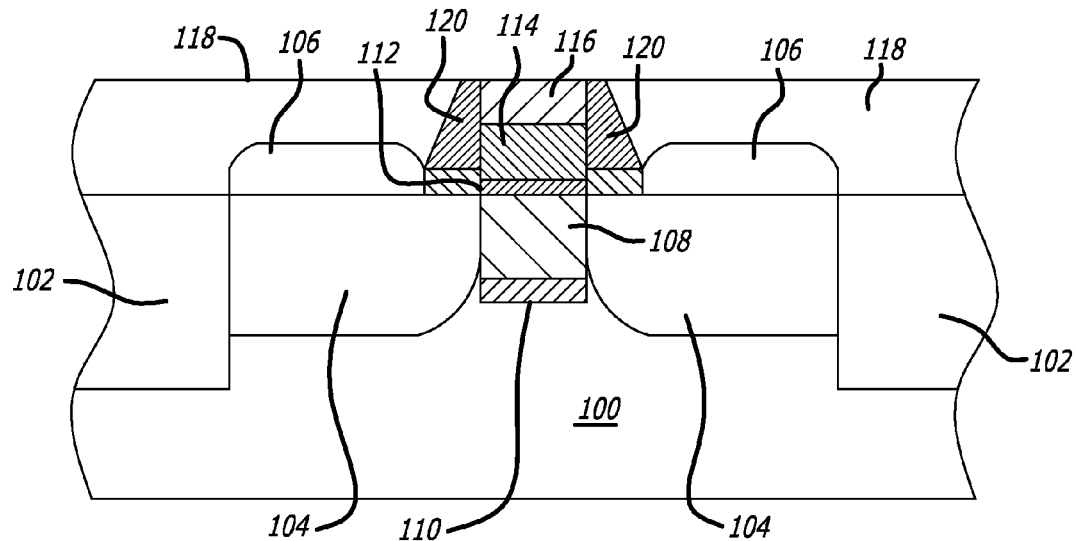
FIG. 4 is a schematic cross-section of a prior art MOSFET with a box-shaped epitaxial recess.

Variation resistant metal-oxide-semiconductor field effect transistors (MOSFETs) are manufactured in accordance with the present invention using a high-K, metal-gate 'channel-last' process. Between spacers formed over a well area having separate drain and source areas, a cavity is formed using a two-step etch process. The first step is a reactive ion etch, which creates an essentially square recess. Thereafter in one embodiment, an ion implant step through the recess results in localized increase in well-doping directly beneath the cavity. The implant is activated by a microsecond annealing which causes minimum dopant diffusion. The second step is a cavity etch that employs one of the well known etches that preferentially etches silicon planes other than the [111] planes. If the recess is aligned with the crystal orientation of the silicon substrate of silicon layer on which the recess had been formed, this preferential etch leaves well defined crystallographic planes at the source and drain sides of the resulting cavity truncating source and drain areas or extensions. Within that cavity an active region is formed using an un-doped or lightly doped epitaxial layer. Because of the well-defined [111] planes, there is little or no tendency for the epitaxial layer to develop facets. A high-K dielectric stack is formed over the lightly doped epitaxial layer, over which a metal gate is formed within the cavity boundaries. Various embodiments are disclosed herein, including variations in the processing and variations in the resulting MOSFETs, including MOSFETs formed in bulk silicon substrates and in the silicon layer of a silicon on insulator (SOI) substrates. In some embodiments of the invention a cap of poly-silicon or amorphous silicon is added on top of the metal gate.

According to the principles of the invention, incorporation into the manufacturing process a step of a very lightly doped, low temperature (such as 750° C. or lower, preferably not exceeding 650° C.) epitaxial layer within a cavity formed for the purpose of creating a channel of a MOSFET that results in a "channel-last" process, reduces the diffusion of dopants from the heavily doped region beneath the low-doped epitaxial layer into the low-doped epitaxial layer. When the MOSFET is part of an integrated circuit, all high temperature processes required or used in fabricating the integrated circuit should be completed by the time the channel epitaxial layer is formed, so that the MOSFET is not subjected to a temperature exceeding 750° C. and preferably 650° C. when and after the channel epitaxial layer is formed. The low-doped epitaxial layer reduces the variations in the MOSFETs' threshold voltage arising from random doping fluctuations (RDF). The thickness of this epi layer is designed, preferably by atomistic simulations of the sort described by Asenov, Brown, Roy and Saini in the prior art, to achieve a preferred threshold voltage and a minimized $\sigma V_T$. Etching through the opening of the sacrificial poly silicon gate and the opposing tips of source and drain extensions reduces the random channel length fluctuations that arise from variations in the lateral position of the edge of the drain and source extension implants, i.e., random extension fluctuations (RXF). The addition of an optional layer of increased doping beneath the low doped epitaxial layer reduces the short channel effects and the threshold voltage fluctuations related to line edge roughness (LER). It also offers a method of adjusting the threshold voltage to a desired value. In the descriptive paragraphs below, the heavily doped region, if used, will in fact be formed by ion implantation.

Figure 5:
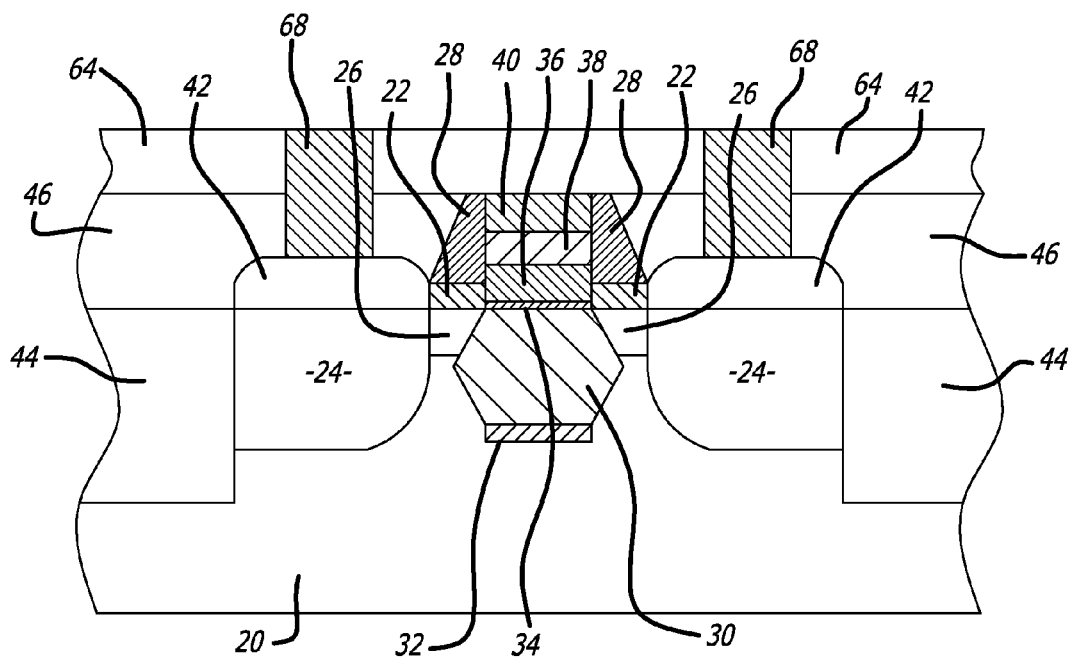
FIG. 5 is a schematic cross-section of a MOSFET manufactured according to the teachings of this invention.

Reference is now made to FIG. 5 that depicts an exemplary and non-limiting schematic cross-section of one embodiment of a MOSFET manufactured in accordance with the principles of the invention. As shall be subsequently illustrated, multiple variations in such a MOSFET may be fabricated as desired. In this embodiment, the substrate 20 is either a silicon or silicon germanium substrate or a silicon layer on a silicon on insulator (SOI) type of substrate, or may be a conventionally doped well in such a substrate. The substrate should be crystallographically oriented, most preferably with a [100] orientation. The scale of the well is large compared to the structures illustrated in this cross-section, and it is typically-doped to $10^{18}$ to $10^{19}$ ions per $cm^3$. The well may be a P-well or an N-well depending on the desired transistor type, N-channel or P-channel respectively. A nitrided silicon dioxide layer 22 provides isolation in surface areas as required for proper fabrication of the MOSFET. Within the well area there are formed source and drain regions 24 and source and drain extensions 26 that are a combination of two highly doped layers. Regions 42 are silicon or silicon/germanium alloy regions. Spacers 28 positioned over the source and drain extensions 26 are used to define the gate region of the MOSFET, in a process that resembles a 'gate last' process and as described herein below in greater detail.

The active region of the transistor consists of the channel epitaxial layer 30 to act as a channel epitaxial layer. The channel epitaxial layer 30 and its quality is key to minimizing threshold variations attributable to RDF random doping fluctuations, and it has to be very lightly doped, from zero (undoped) to something less than $1 \times 10^{16}$ ions/$cm^3$ or less than $1 \times 10^{10}$ doping ions per $cm^2$. Further, the thickness of this layer is not arbitrary; it is defined by the need to effect a large reduction in the $\sigma V_T$. While this thickness is a matter of specific design, prior analysis and experimentation indicate that 10 nm is a representative thickness. Note that, in this structure, the sidewalls are not square; but are defined by crystallographic planes. The highly doped region 32 is optional, and the doping gradient between highly doped region 32 and channel epitaxial layer 30 should be extremely steep to realize the full RDF benefits of this invention. Alternatively in this and other embodiments incorporating the highly doped region, the highly doped region 32 may be a delta (δ) layer, typically formed using molecular beam epitaxy, after the cavity containing the channel epitaxial layer 30 is formed, but before the channel epi itself is grown. Interface dielectric layer 34 and high-K dielectric 36 separate the active channel from the metallic gate 38, with a gate connecting and protecting layer 40 above the metallic gate 38.

The channel epitaxial layer 30 is lightly doped so that it is effectively charge free under normal operating conditions. This pertains if its doping level is between zero and $1 \times 10^{16}$ ions/$cm^3$ and its thickness is between 5 nm and 50 nm depending on the gate length (length between source and drain extensions 26) of the transistor. The thickness of the channel epitaxial layer 31 is chosen to realize a substantial or an optimum reduction in the $\sigma V_T$ in the completed transistor. This design step will normally be accomplished using multiple simulations with the charge state of each atomic site defined by Monte Carlo simulations similar to that described by Asenov in his 1999 publication cited above and in "Random dopant induced threshold voltage lowering and fluctuations in sub-0.1 μm MOSFET's: A 3-D "atomistic" simulation study," IEEE Transactions on Electron Devices, Vol. 45, No. 12, December 1998, Pages 2505-2513. In this embodiment, the boundaries of the channel epitaxial layer 30 at the source and drain sides are distinguished by being [111] planes defined by the preferential etch forming the crystallographically etched cavity 60 in the underlying silicon for the channel epitaxial layer 30. The ends of the cavity 60 perpendicular to the [111] planes defining the channel width are defined by insulator filled isolation trenches 44. Beneath the channel epitaxial layer 30 is an optional highly doped region 32. It is doped to a concentration between $5 \times 10^{18}$ ions/$cm^3$ to $5 \times 10^{20}$ ions/$cm^3$. The thickness of highly doped region 32 is not critical (and may be a δ layer), but will usually have a thickness in the range of 10 nm to 1000 nm. For N-channel MOSFETs, highly doped region 32 will incorporate a P-type dopant like boron or indium. For P-channel MOSFETs, highly doped region 32 will incorporate an N-type dopant like phosphorus or arsenic.

A high-K dielectric stack comprising interface dielectric layer 34 and high-K dielectric 36 is positioned above the channel epitaxial layer 30. Interface dielectric layer 34 is an optional interface dielectric, typically one or two monolayers of silicon dioxide. In combination with the high-K dielectric 36 above it, this stack will typically have an effective oxide thickness ranging between 0.5 nm and 3 nm. On top of the high-K dielectric 36 is a metallic gate 38 having a typical thickness of 80 to 200 nm. As previously stated, it is important to preserve a very high gradient in the charge density between the channel epitaxial layer 30 and the highly doped region 32. This requires that all high temperature steps be completed prior to the epitaxial growth of channel epitaxial layer 30. This is consistent with gate last and channel last processing as described herein.

Figure 6A:
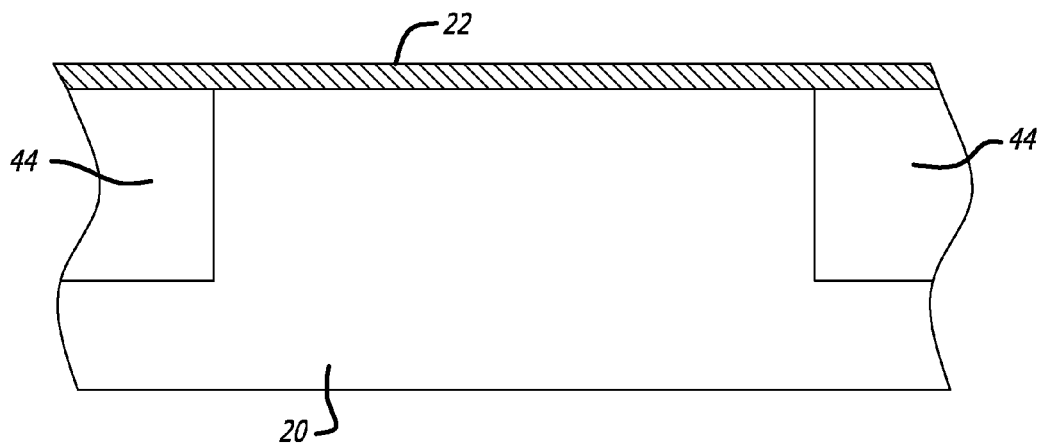
FIGS. 6A through 6O illustrate the manufacturing sequence for a preferred embodiment of the present device.
Figure 6B:
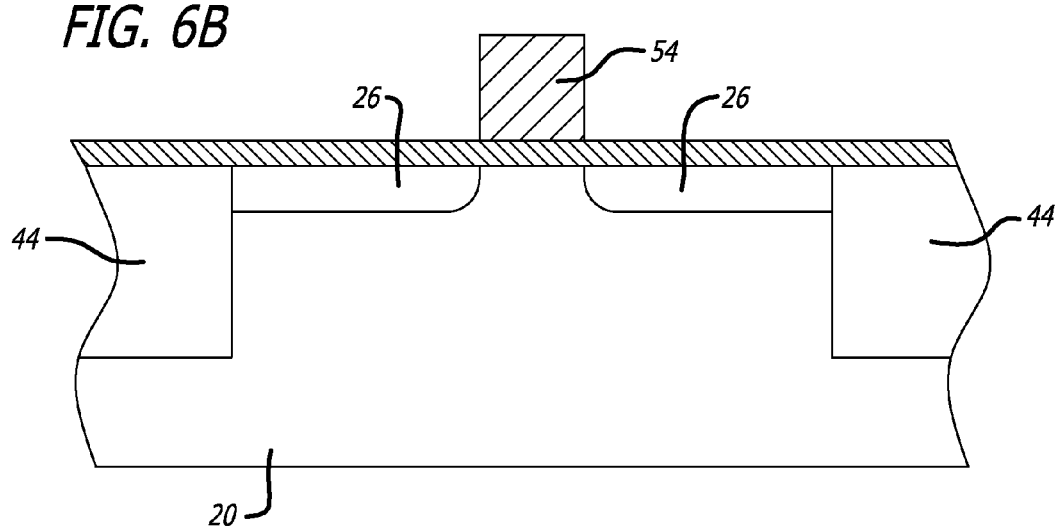
FIG. 6B is a schematic cross-section showing a polysilicon sacrificial gate and the addition of a drain extension implant.

Other parts of an exemplary completed MOSFET in accordance with the present invention also visible in the cross-section of FIG. 5 are insulator filled isolation trenches 44, a first interlayer dielectric 46, a second interlayer dielectric 64, and metal contacts 68 (typically tungsten) to silicon or silicon/germanium alloy regions 42 on the source and drain regions 24. The gate is also typically electrically connected by a tungsten plug contacting the connecting and protecting layer 40. This connection does not appear in FIG. 5 because it is industry practice to absolutely avoid making contact to the gate directly over the gate dielectric stack 34 and 36. FIGS. 6A through 6O schematically illustrate exemplary and non-limiting processing to achieve one embodiment of the 'channel-last' MOSFET with an epitaxial channel taking advantage of the preferential growth conditions provided, incorporating the optional localized region of high doping, and assuring a steep gradient of doping density between those two regions if used, namely the embodiment shown in FIG. 5.

FIG. 6A shows a cross-section of the substrate after insulator filled isolation trenches 44 are formed on the substrate or well region 20 and covered by a nitrided $SiO_2$ layer 22 (see remnants of the nitrided $SiO_2$ layer 22 in FIG. 5). Such a nitrided $SiO_2$ layer 22 could be of a typical thickness of 3.5 nanometers, but it may range between 2 nanometers and 8 nanometers, but not limited thereto. A polysilicon or amorphous sacrificial silicon gate structure 54 (FIG. 6B) is positioned and defined to localize the final channel area of the transistor being constructed. The width of sacrificial gate structure 54 (in the plane of the figure) is nominally equal to the final physical channel length of the transistor, typically between 10 nm and 35 nm. The schematic cross-section of FIG. 6B shows the sacrificial gate structure 54 is used as a hard mask to define the locations of drain and source extensions 26. In the same way, sacrificial gate structure 54 also defines the position of any pocket implants (not shown) if and when necessary and/or applicable. Nitrided $SiO_2$ layer 22 acts as a screen oxide during these implant steps.

Figure 6C:
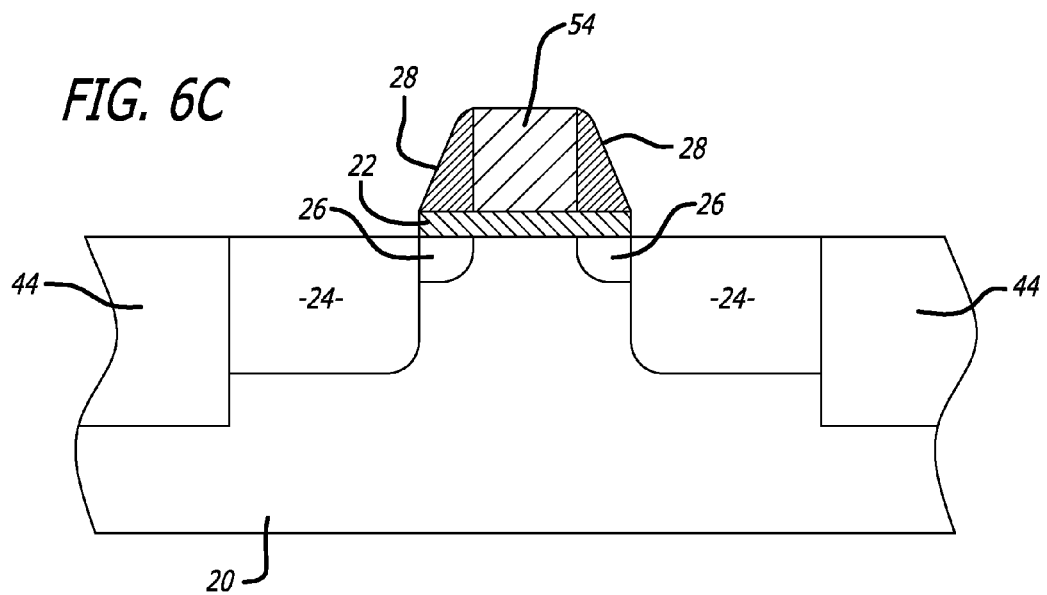
FIG. 6C is a schematic cross-section showing the addition of spacers on each side of the sacrificial gate and a subsequent source/drain implant.

FIG. 6C is a cross-section showing the spacers 28 that are created by deposition of nitride or a combination of nitride and oxide, then anisotropically etched with reactive ions impacting the wafer surface perpendicularly. This selectively erodes the deposited sidewall material and removes the regions paralleling the wafer surface, with the vertical or tapered sidewall sections forming spacers 28 remaining. In certain embodiments, the spacers 28 are formed by repeating the deposition-and-etch process.

Figure 6D:
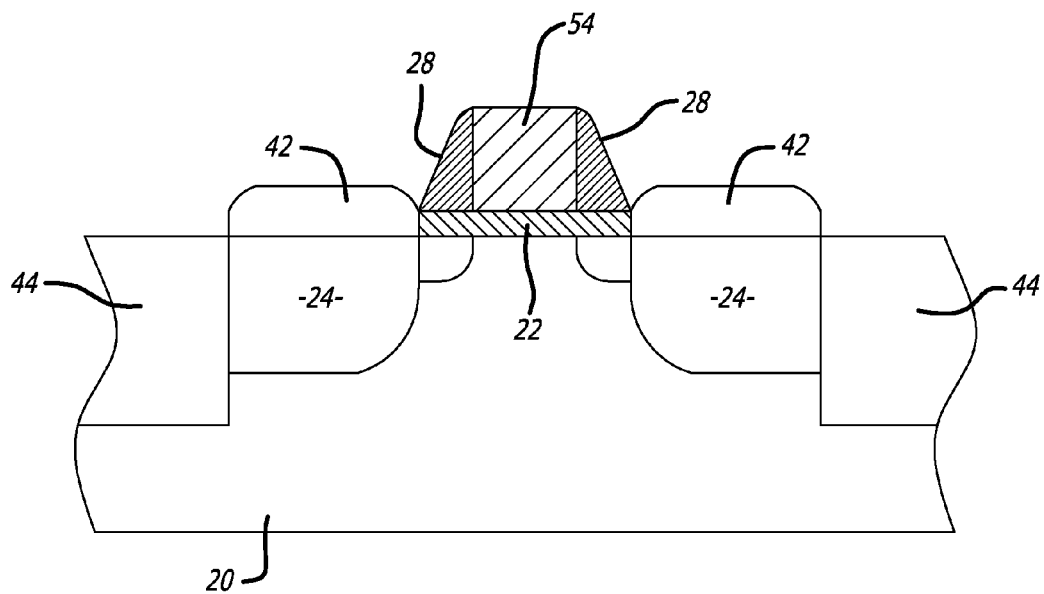
FIG. 6D is a schematic cross-section showing the completion of the drain structure with a heavy source-drain implant and an epitaxial source-drain buttress to reduce parasitic resistance.

After the formation of the spacers, the heavily doped source and drain regions 24 can be implanted through nitrided $SiO_2$ layer 22, using the spacers 28 as masks. After annealing the accumulated implants, the nitrided $SiO_2$ layer 22 is removed except where it is protected by the spacers 28 as shown in FIG. 6C. Additional silicon or silicon/germanium alloy regions 42 may be epitaxially grown to elevate the top of the source and drain regions above the original silicon surface and optionally to insert compressive strain in a p-channel MOSFET, as shown in FIG. 6D. Silicon/Germanium (Si:Ge) or Silicon/Carbon (Si:C) stressors, in some cases with a Σ shape, can also be embedded by partial etching of the source and drain regions and epitaxial regrowth of the stressors. In all cases, these silicon or silicon/germanium alloy regions 42 are doped to have high conductivity to assure good connection to their eventual contacts and to minimize parasitic series resistance. Further reduction of parasitic resistance may be effected by growing a metallic silicide, like $Ni_2Si$, over silicon or silicon/germanium alloy regions 42 or in a slightly different configuration, growing a metallic silicide directly on the regions 24.

Figure 6E:
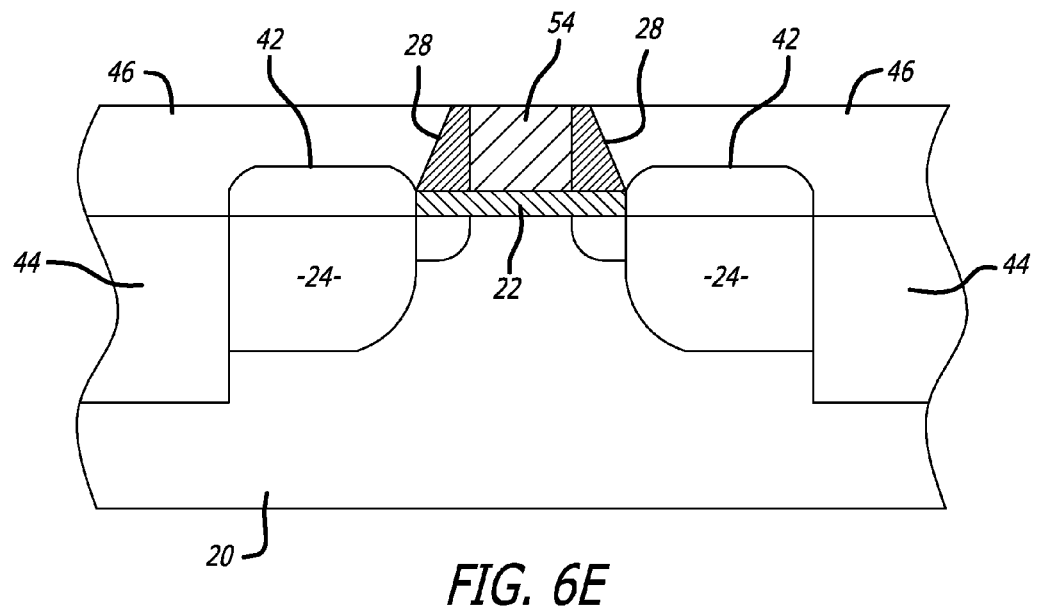
FIG. 6E is a schematic cross-section showing the result and depositing the first interlayer dielectric and subjecting it to a chemical mechanical polishing step.

FIG. 6E shows a cross-section after a first interlayer dielectric 46 is deposited and then subsequently polished using chemical/mechanical polishing (CMP) to create a planar surface and to expose the top of sacrificial gate structure 54.

Figure 6F:
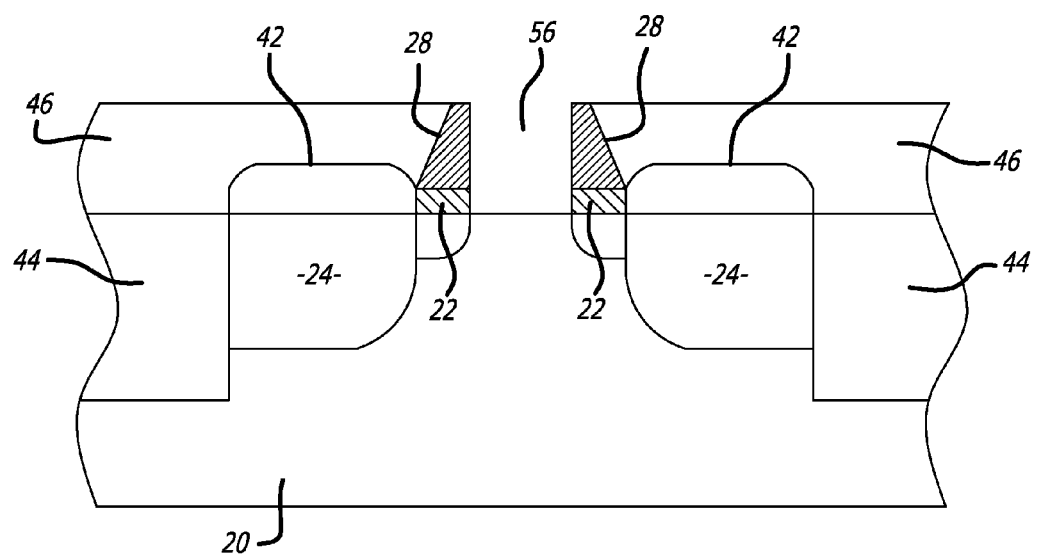
FIG. 6F is a schematic cross-section showing the removal of the sacrificial gate and its underlying protective oxide.

At this point, the process sequence uses some steps that are normally associated with "Gate Last" processing. (This topic is reviewed by Martin Frank in "High-k/metal gate innovations enabling continued CMOS scaling," in the 2011 Proceedings of the ESSCIRC on pages 50, 58, 12-16 Sep. 2011.) The cross-section in FIG. 6F shows the sacrificial gate structure 54 etched away, as well as the portion of the nitrided $SiO_2$ layer 22 beneath the sacrificial gate structure 54. This leaves a recess 56 bounded on its sides by the spacers 28 and reaching to the underlying substrate 20 and source and drain extensions 26 at its bottom.

Figure 6G:
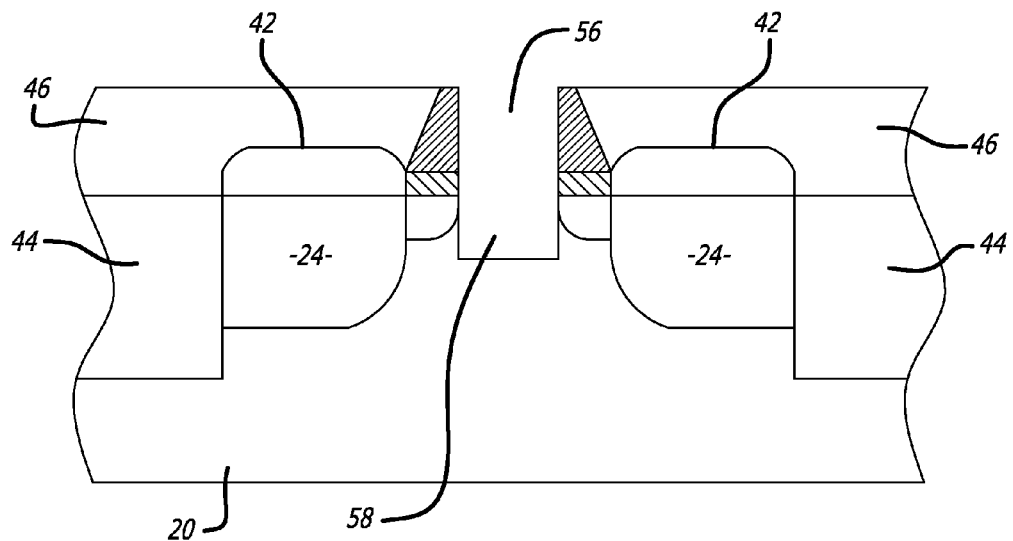
FIG. 6G is a schematic cross-section showing the result of an anisotropic etch creating a recess in the substrate silicon.

In FIG. 6G the schematic cross-section showing a further recess 58 is defined by the spacers 28 acting as hard masks. The depth of recess 56 must be controlled by the etch rate. The duration of etch is controlled such that the RIE etch depth is approximately half the ultimate design thickness of the planned channel epitaxial layer 30 in FIG. 5. As noted above, the ultimate design thickness is defined through atomistic simulation or a similar statistically valid design method to effect a major reduction, 3:1 or more, in the RDF component of $\sigma V_T$, relative to a conventionally doped transistor. For instance, if the design thickness for the channel epitaxial layer 30 is to be 10 nm, the RIE depth should be 5 nm.

Figure 6H:
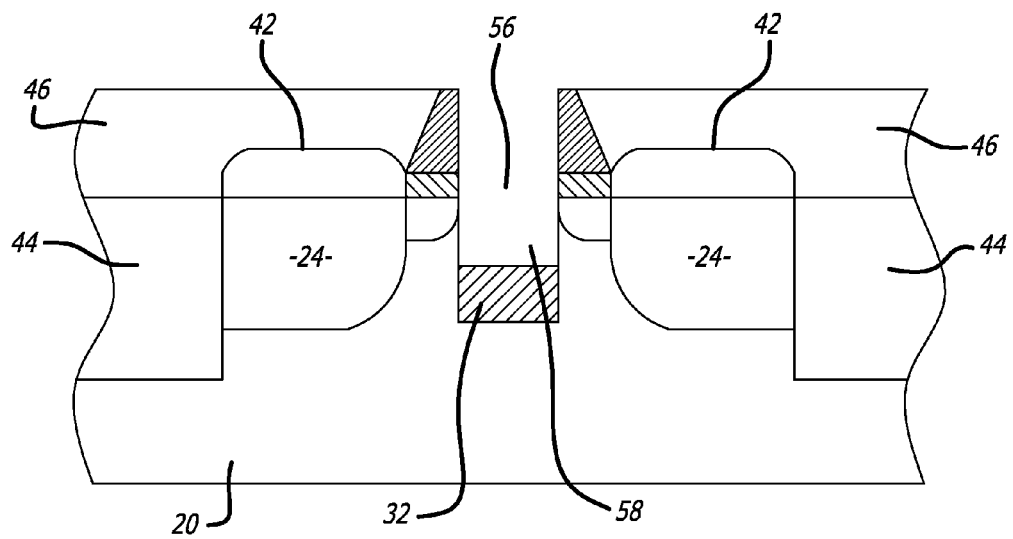
FIG. 6H is a schematic cross-section showing the implantation of a heavily doped layer beneath the etched recess.

At this stage, there are three optional processing paths. FIG. 6H shows one of those options. In this case, ion implantation is used to create a highly doped region 32 in the substrate beneath the further recess 58. For a P-channel MOSFET, this region will be created by implanting boron or indium to achieve an activated doping density of between $5 \times 10^{18}$ ions/cm$^3$ to $5 \times 10^{20}$ ions/cm$^3$. For an N-channel MOSFET, this region will be created by implanting phosphorus, arsenic or antimony to achieve an activated doping density of between $5 \times 10^{18}$ ions/cm$^3$ to $5 \times 10^{20}$ ions/cm$^3$. Following the implantation, this implant must be activated by any one of several rapid thermal annealing processes, such as for example, lamp, flash or laser. One paramount consideration in this sequence is minimizing the subsequent diffusion of the dopant in highly doped region 32 into the channel epitaxial layer 30 (FIG. 5). In addition to managing the thermal budget, control over the diffusion of this implant can be effected by implanting carbon as well as phosphorus, as demonstrated by B. J. Pawlak, R. Duffy, et al. ["Suppression of phosphorus diffusion by carbon co-implantation," Appl. Phys. Lett. 89, 062102 (2006)] or by implanting carbon as well as boron as demonstrated by B. J. Pawlak, T. Janssens, et al. ["Effect of amorphization and carbon co-doping on activation and diffusion of boron in silicon," Appl. Phys. Lett. 89, 062110 (2006)].

Figure 6I:
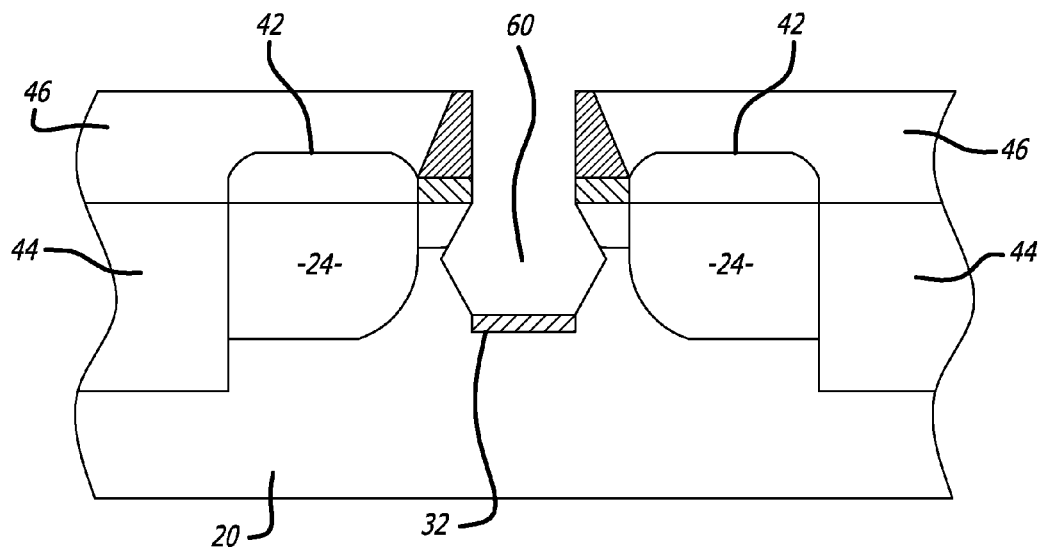
FIG. 6I is a schematic cross-section showing the result of a crystallographic, selective etch, completing the recess in the substrate.

Etching the further recess 58 is shown completed in FIG. 6I. The final portion of the recess etch is done with any one of several well-known combinations, all strong bases, such as for example, ethylene-diamine pyrocatechol in water, potassium hydroxide (KOH) in isopropynol or tetramethyl-ammonium hydroxide (TMAH) in water. In the proper concentrations and at the proper temperatures, these solutions etch the [111] planes at a negligibly slow rate. One of these etches, say KOH, should be used to etch the further recess 58 to form a crystallographically etched cavity 60 having a final depth of approximately twice the depth achieved with the prior RIE step. Normal range for this final depth would be 5 nm to 15 nm, leaving highly doped region 32 at the bottom.

The crystallographically etched cavity 60 is a key to the achievement of the objectives of the present invention. In particular, if the silicon substrate for a bulk silicon, or the silicon layer on insulator for an SOI substrate, has a [100] crystal orientation and the MOSFET being fabricated is appropriately aligned with the crystal orientation, then the sides of the cavity 60 will be oriented along the [111] planes. This is illustrated in FIG. 6I which illustrates the etching of a simple recess into the surface of bulk silicon or a silicon layer. Note however, when viewed from above the surface of the silicon layer, the rectangular horizontal cross-sections of this example have an angular orientation relative to the silicon layer determined by the orientation of spacers 28 with respect to the die (or wafer). This, of course, doesn't happen automatically, as the orientation of the [111] planes relative to the orientation of the die on a wafer must be carefully controlled to achieve this. With the proper alignment, the apparently flat sides of the cavity 60 are actually the edges of the flat surfaces of the [111] planes, with the top edges being aligned with the bottom edges of the nitrided silicon dioxide layer 22 under the spacers 28. Without this alignment, the sides of the cavity will necessarily be multiple irregular [111] planes to the extent of the misalignment. Of course, in accordance with the foregoing description, the initial orientation of the sacrificial silicon gate structure 54 determines the orientations achieved in the subsequent processes.

With respect to the direction perpendicular to FIG. 6I, note that as stated before, the channel width, an important circuit design parameter, is defined by the insulator filled isolation trenches 44, which effectively surround the entire transistor. Generally the sacrificial gate 54 will be added after the insulator filled isolation trenches 44 are formed, and it will be sized and located so that the sacrificial gate overlaps the edges of the insulator filled isolation trenches 44. Thus the recess 56 will have a dimension perpendicular to the plane of FIG. 6G that is greater than the local separation of the insulator filled isolation trenches 44. When the recess is further etched as shown in FIG. 6I, the further recess 58 will stop at the insulator filled isolation trenches 44. Thus when the gate is subsequently formed, it will extend on each end over the isolation 44 boundaries that define the channel width. This extension assures the integrity of the transistor, and it provides a region to which electrical contact can be made.

Figure 6J:
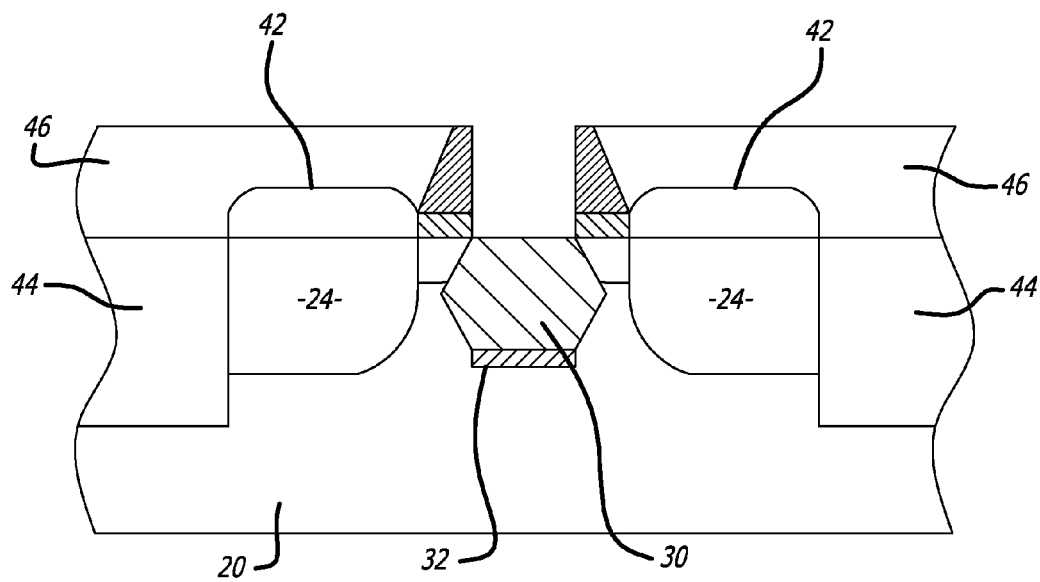
FIG. 6J is a schematic cross-section showing the growth of a zero-doped epitaxial layer in the recess.

The next step is shown in FIG. 6J. The cavity 60 is filled by growing a channel epitaxial layer 30 of silicon, silicon-germanium, germanium or a compatible III-V compound. This channel epitaxial layer 30 must have an extremely low doping density, approximately zero, but certainly not exceeding $1 \times 10^{17}$ ions/cm$^3$.

Figure 6K:
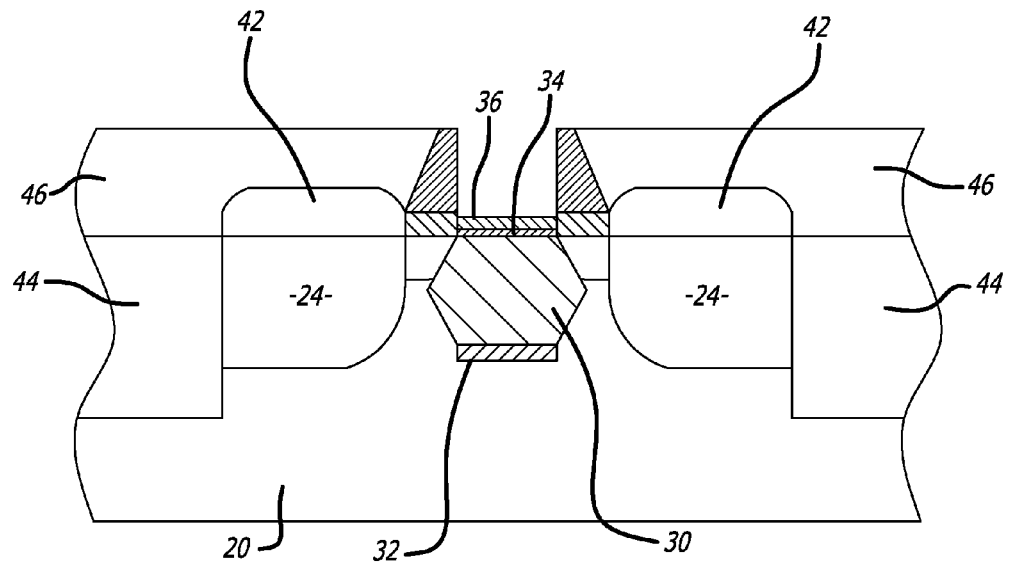
FIG. 6K is a schematic cross-section showing the gate dielectric structure grown and deposited over the epitaxial layer.

According to normal gate last semiconductor processing, the gate dielectric structure is fabricated as indicated in FIG. 6K. Optionally, an interface dielectric layer 34 of silicon dioxide is formed over the channel epitaxial layer 30. This layer, if used, is a fraction of a nm thick. The high-K dielectric 36 is subsequently deposited, such as an oxide, nitride or oxy-nitride of hafnium, for instance.

Figure 6L:
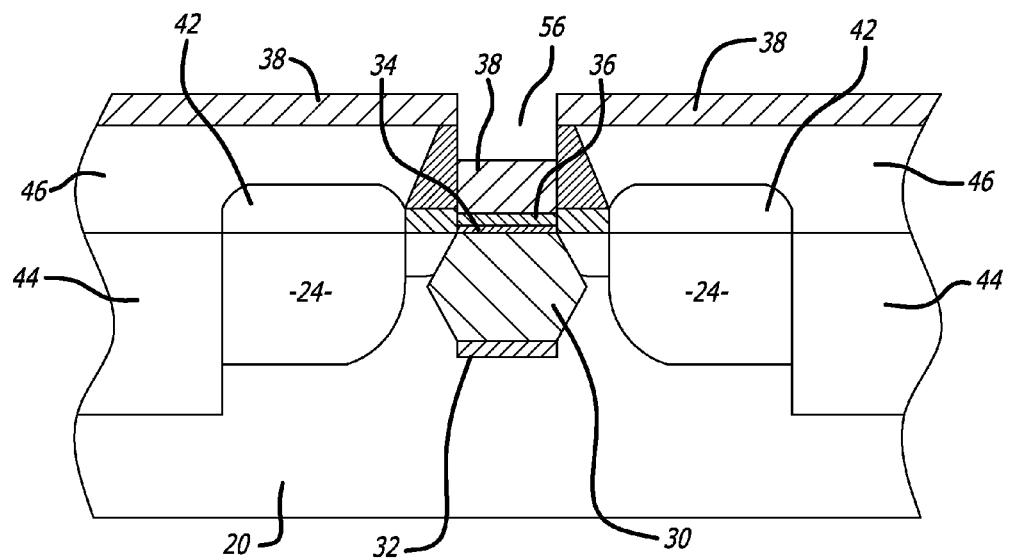
FIG. 6L is a schematic cross-section showing the deposition of the metallic gate material over the gate dielectric structure.

Continuing with gate last practice in FIG. 6L, one or more metallic gates 38 are deposited in the recess 56 over interface dielectric layer 34 and high-K dielectric 36 forming the high-K gate dielectric. The metallic layers are chosen particularly for their work function, which is one important parameter defining the threshold voltage of the transistors. A variety of metals and metallic compounds are used; TiN and NiSi are two examples. Note that the deposition process for the metallic gate 38 will normally also result in a deposited layer over the top of the first interlayer dielectric 46.

Figure 6M:
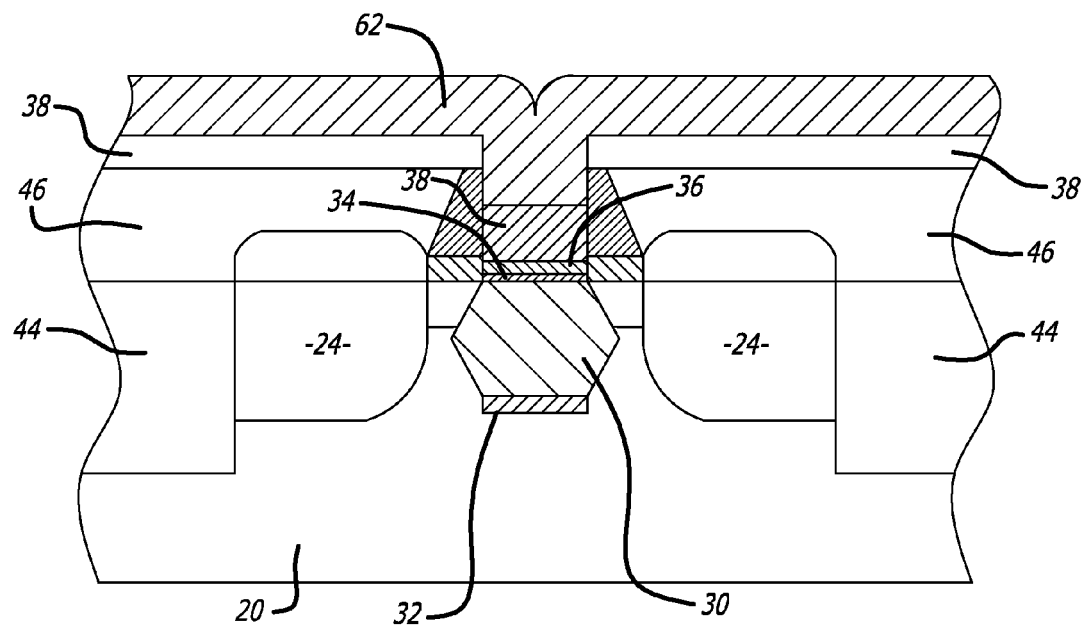
FIG. 6M is a schematic cross-section showing the deposition of the gate contacting material over the protective gate.

Subsequent to depositing the metal gate, as shown in FIG. 6M, a layer 62 is deposited as a gate handle to provide physical protection and electrical connection to the metallic gate 38. This material is typically doped amorphous silicon, although other choices exist.

Figure 6N:
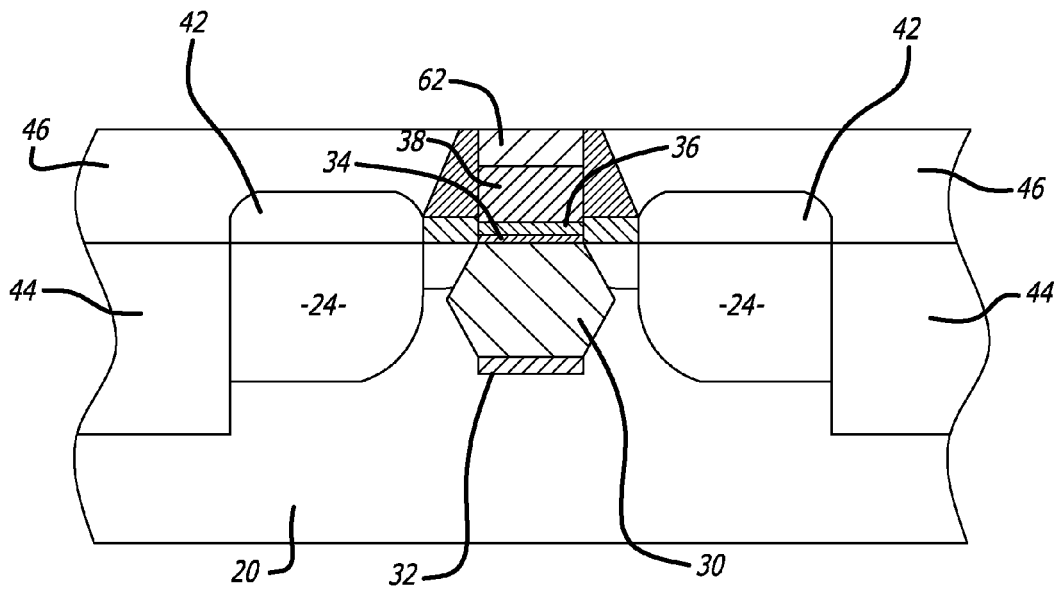
FIG. 6N is a schematic cross-section showing the result of chemical mechanical polishing the conductive materials off the first interlayer dielectric.
Figure 6O:
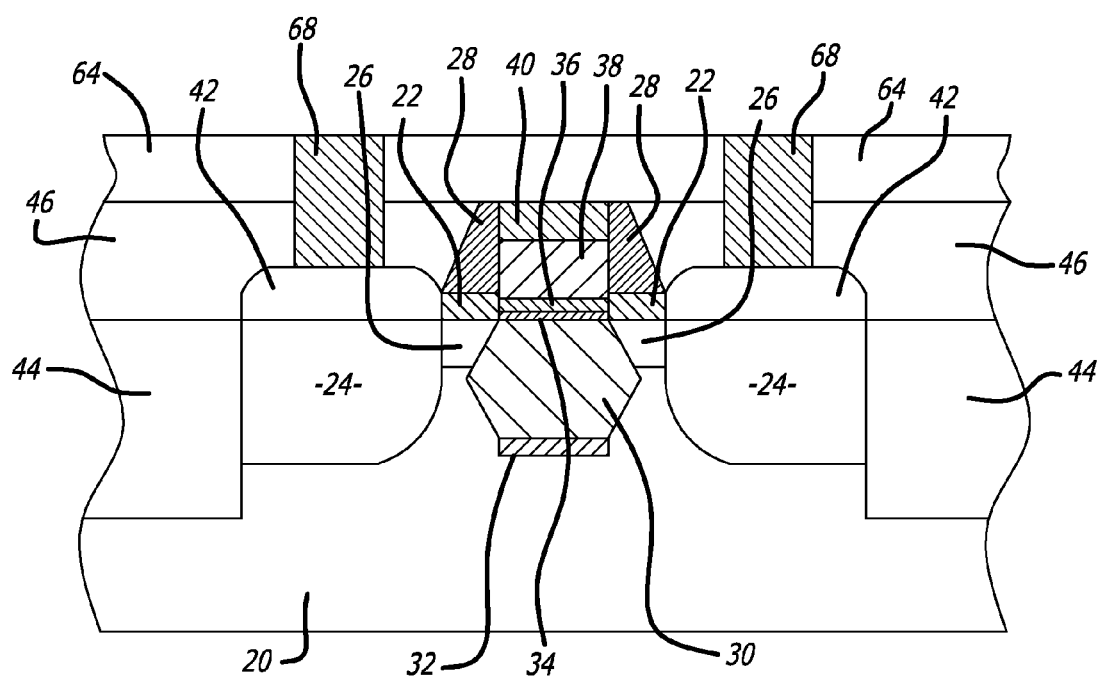

FIG. 6N illustrates the effect of CMP, which is used to clear both metallic gate 38 and layer 62 from the top of the first interlayer dielectric 46.

The transistor fabrication is completed in FIG. 6O by the deposition of the second interlayer dielectric 64, then etching contact holes to electrically access the source and drain regions 24 through silicon or silicon/germanium alloy regions 42. Contact holes are also formed over that part of the gate handle 62 that extends over the dielectric filled trench isolation 44. These contact holes are typically filled, using chemical vapor deposition, with tungsten contacts 68 to provide electrical contact to all regions of the transistors. FIG. 6O shows the schematic cross-section after CMP has been used to clear the deposited tungsten from the top surface of the second interlayer dielectric 64. At this point, the transistor fabrication is complete, and the devices are ready for interconnection by any of the common metallization methods.

For reasons of process control or processing convenience, one may elect to execute the ion implantation step for highly doped region 32 in FIG. 6H either early or later in the process. For instance, the implant may be executed prior to etching the further recess 58. That would mean the implantation would be done after the recess 56 was etched, as shown in FIG. 6F. Note that the sidewalls of the spacers 28 still act to define the lateral extent of the implant. As a practical matter, implanting immediately after the recess 56 was etched would require an upward adjustment in the implant energy. Alternatively, the implant could be delayed until after the crystallographically etched cavity 60 has been completely etched, as in FIG. 6I. An implant at this stage in the process might require a downward adjustment in the implant energy. In any event, the highly doped region 32 must be thermally activated prior to growing the very lightly doped channel epitaxial layer 30.

Figure 7:
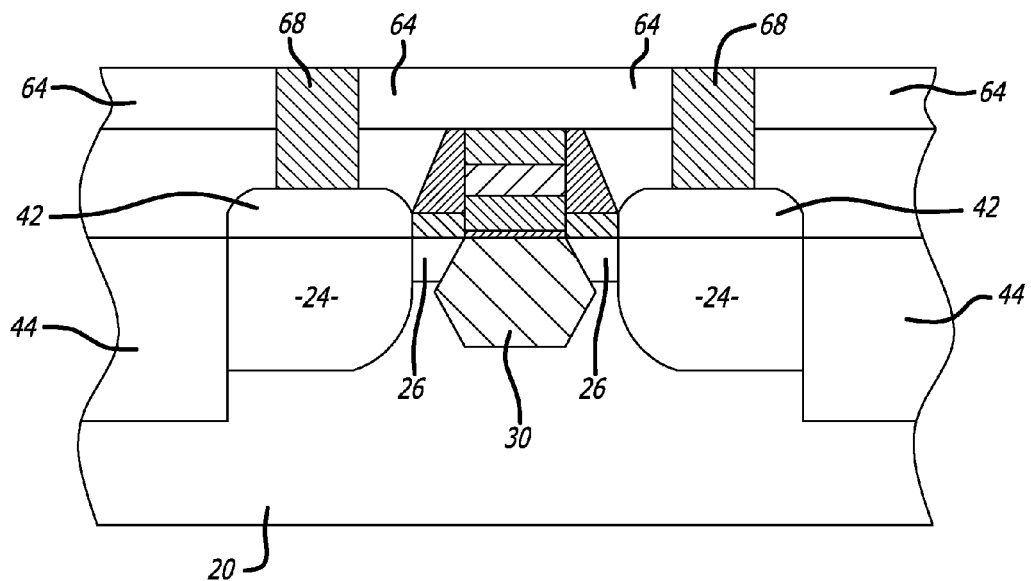
FIG. 7 is a schematic cross-section of an embodiment of the invention wherein the highly doped region 32 is not used.
Figure 8:
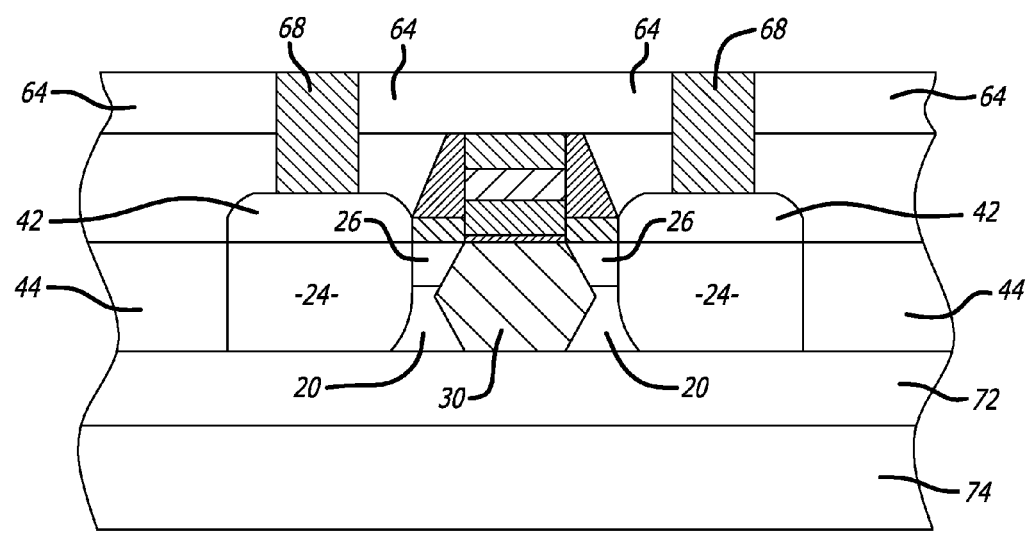
FIG. 8 is a schematic cross-section illustrating an alternative MOSFETs in accordance with the present invention as fabricated on a SOI (silicon on insulator) substrate.
Figure 9:
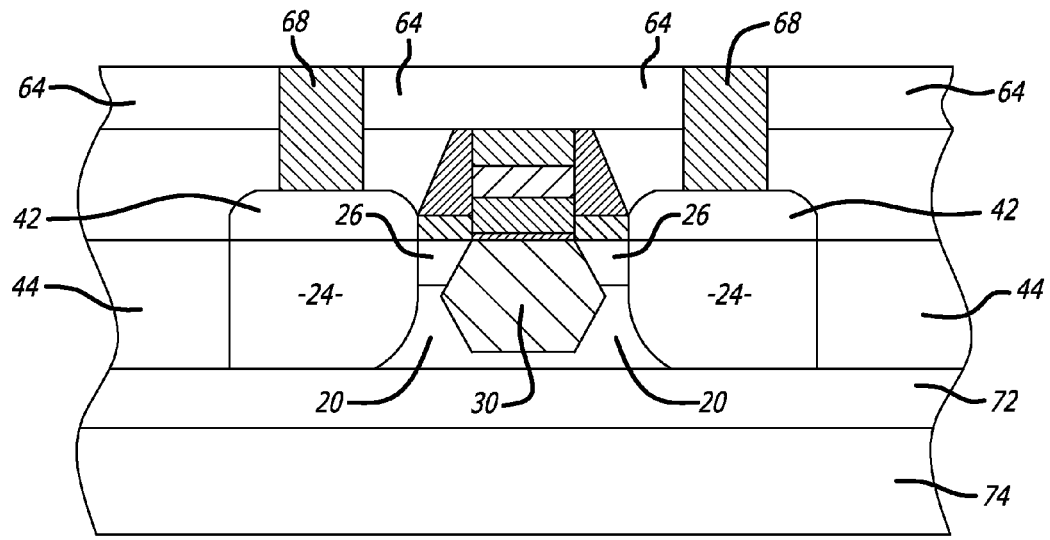
FIG. 9 is a schematic cross-section illustrating a further alternative embodiment wherein the cavity containing the channel epitaxial layer 30 need not extend all the way to the buried oxide layer.
Figure 10:
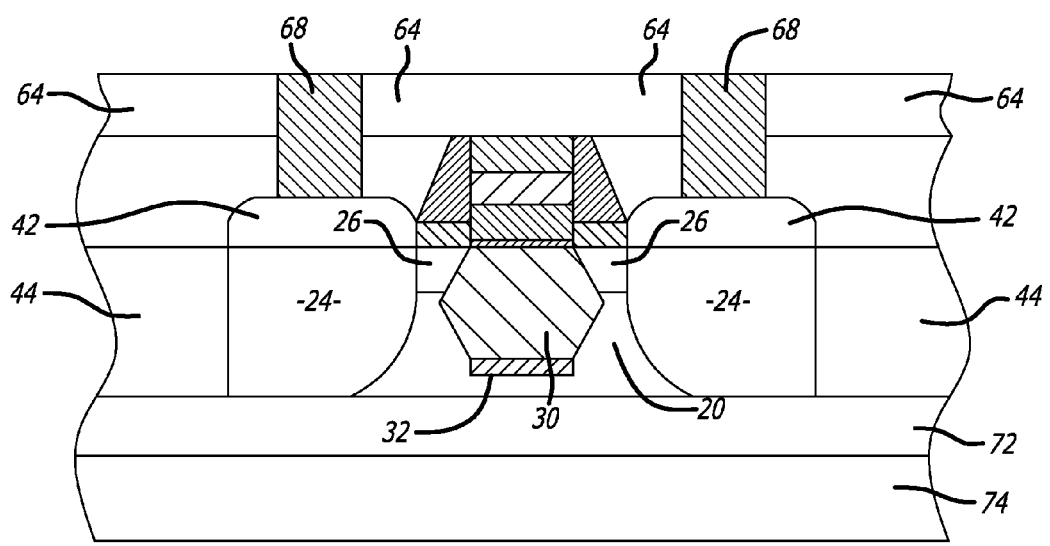
FIG. 10 is a schematic cross-section of a still further alternative embodiment wherein the highly doped region (or δ layer) is implanted at the bottom of the cavity before the channel epitaxial layer is formed and does not extend to the buried oxide layer.
Figure 11:
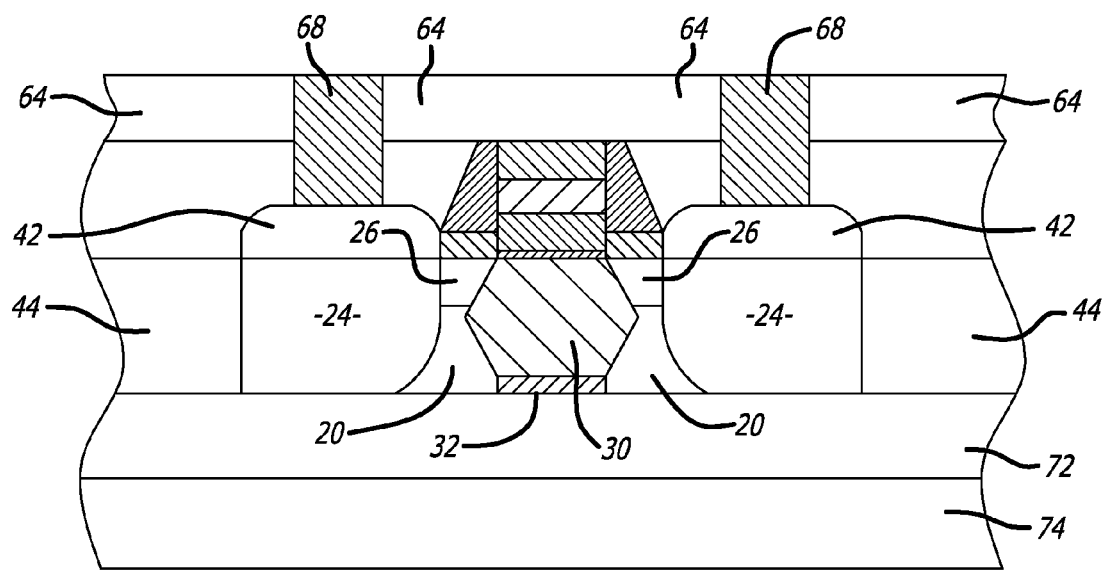
FIG. 11 is a schematic cross-section of a still further alternative embodiment wherein the highly doped region (or δ layer) is implanted at the bottom of the cavity before the channel epitaxial layer is formed and does extend to the buried oxide layer.

While the highly doped region 32 generally results in superior performance in terms of random doping variations in threshold voltage and drain voltage modulation of channel length, this implant can be omitted without deviating from the essence of this invention, as shown in FIG. 7. As further alternatives, MOSFETs in accordance with the present invention may be fabricated on a SOI (silicon on insulator) substrate. One such device is illustrated in FIG. 8. Applying the prior described embodiments of the invention to such configurations, the substrate 20 of those previously described embodiments becomes the silicon or silicon/germanium layer on the buried oxide layer 72 on the substrate 74 in which the MOSFET is fabricated. In FIG. 8, the optional highly doped region 32 of FIG. 5 has been eliminated and the cavity containing the channel epitaxial layer 30 extends to the buried oxide layer 72. As an alternative, the cavity containing the channel epitaxial layer 30 need not extend all the way to the buried oxide layer 72, as illustrated in FIG. 9, or as further alternative, the highly doped region (or δ layer) 32 may be implanted at the bottom of the cavity before the channel epitaxial layer 30 is formed, with the highly doped region (or δ layer) 32 either not extending to the buried oxide layer 72, as illustrated in FIG. 10, or extending to the buried oxide layer 72, as illustrated in FIG. 11.

Hence it should be understood by those of ordinary skill in the art that this embodiment of the "channel-last" process incorporates a crystallographic etch to form a channel last recess which has [111] crystal planes for its walls, but not for its bottom. The channel, comprising an un-doped or lightly doped epitaxial layer that is grown in the channel recess, will have superior crystal structure to an equivalent channel grown without this improvement.

The invention disclosed herein describes a general well which may be an N-well or a P-well, and hence suitable for a channel of a PMOS or NMOS transistor respectively. Further, the electrostatic characteristics of partially depleted SOI (silicon-on-insulator) transistors are sufficiently similar to bulk semiconductors that all the techniques described in this invention are equally applicable to partially depleted SOI devices. A person of ordinary skill-in-the-art would readily understand that the invention can be adapted for use in a plurality of ways, including integrated circuits where all transistors or a portion thereof are manufactured using the techniques disclosed hereinabove. Furthermore, although the invention is described herein with reference to the preferred embodiment, one skilled-in-the-art will readily appreciate that other applications may be substituted for those set forth herein without departing from the spirit and scope of the present invention. Accordingly, the invention should only be limited by the claims included below.

What is claimed is:

1. A method of manufacturing a metal-oxide-semiconductor field effect transistor (MOSFET) comprising:
   a) forming source and drain regions in a silicon surface;
   b) forming a recess in the silicon between the source and drain regions, the recess having first vertical sidewalls adjacent the source and drain regions defined by spacers formed above the silicon surface, and second vertical sidewalls defined by isolation regions;
   c) selectively etching within the recess using an etch having a crystallographic selectivity to form a cavity having sidewalls of the cavity touching the source and drain regions defined by [111] crystal planes;
   d) growing a channel epitaxial layer in the cavity;
   e) providing a gate insulator over the top of the channel epitaxial layer, and depositing a gate over the gate insulator;
   f) growing the channel epitaxial layer in the cavity in d) and all subsequent processes being completed at temperatures of 750° C. or lower.

2. The method of claim 1 wherein growing the channel epitaxial layer in the cavity in d) and all subsequent processes are completed at temperatures not exceeding 650° C.

3. The method of claim 1 wherein in d), the channel epitaxial layer has a doping concentration ranging from zero to less than $1 \times 10^{17}$ ions/cm$^3$.

4. The method of claim 1 further comprising:
   g) implanting a doped region at the bottom of the cavity prior to d).

5. The method of claim 1 wherein the doped region of g) is doped to a concentration between $5 \times 10^{18}$ ions/cm$^3$ to $5 \times 10^{20}$ ions/cm$^3$.

6. The method of claim 5 wherein the doped regions is a delta layer.

7. The method of claim 1 wherein in c), the sidewalls of the cavity touching the source and drain regions defined by [111] crystal planes adjacent touch the source and drain regions through source and drain extensions.

8. The method of claim 1 wherein the silicon surface is the surface of a bulk silicon substrate.

9. The method of claim 1 wherein the silicon surface is defined by a silicon layer on an insulator.

10. The method of claim 9 wherein in c), the cavity extends through silicon layer to the insulator.

11. The method of claim 9 wherein the cavity does not extend through silicon layer to the insulator.

12. The method of claim 9 wherein the cavity formed in c) does not extend through silicon layer to the insulator.

13. The method of claim 12 further comprising:
   g) implanting a doped region at the bottom of the cavity prior to d).

14. The method of claim 13 wherein in g), the doped region does not extend to the insulator.

15. The method of claim 13 wherein in g), the doped region extends to the insulator.

16. The method of claim 1 wherein the gate insulator has a dielectric constant of at least 6.

17. The method of claim 1 wherein the gate is a metallic gate.

18. The method of claim 1 wherein in a), forming the source and drain regions in a silicon surface comprises:
   forming a sacrificial gate;
   forming source and drain extensions using the sacrificial gate as a mask;
   forming spacers on the sacrificial gate; and
   forming the source and drain regions using the spacers and the sacrificial gate as a mask.

* * * * *